US012750026B2

(12) United States Patent
Li et al.

(10) Patent No.: US 12,750,026 B2
(45) **Date of Patent: *Sep. 29, 2026**

(54) TUNABLE EFFECTIVE INDUCTANCE FOR MULTI-GAIN LNA WITH INDUCTIVE SOURCE DEGENERATION

(71) Applicant: pSemi Corporation, San Diego, CA (US)

(72) Inventors: Jing Li, Austin, TX (US); Emre Ayranci, Costa Mesa, CA (US); Miles Sanner, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 252 days.

This patent is subject to a terminal disclaimer.

(21) Appl. No.: 18/418,147

(22) Filed: Jan. 19, 2024

(65) Prior Publication Data

US 2024/0171145 A1 May 23, 2024

Related U.S. Application Data

(63) Continuation of application No. 17/671,374, filed on Feb. 14, 2022, now Pat. No. 11,881,828, which is a (Continued)

(51) Int. Cl.
*H03G 3/30* (2006.01)
*H03F 1/22* (2006.01)
(Continued)

(52) U.S. Cl.
CPC ........... *H03G 3/3036* (2013.01); *H03F 1/223* (2013.01); *H03F 1/3205* (2013.01); *H03F 3/193* (2013.01);
(Continued)

(58) Field of Classification Search
CPC .. H03G 3/3036; H03G 1/0023; H03G 1/0029; H03G 1/0088; H03G 3/001;
(Continued)

(56) References Cited

U.S. PATENT DOCUMENTS 6,977,552 B2 12/2005 Macedo
8,264,282 B1 9/2012 Riekki
(Continued)

FOREIGN PATENT DOCUMENTS

CN 105281680 12/1899
JP 2008118321 5/2008
(Continued)

*Primary Examiner* — Hieu P Nguyen
(74) *Attorney, Agent, or Firm* — Haynes and Boone, LLP

(57) ABSTRACT

A multi-gain LNA with inductive source degeneration is presented. The inductive source degeneration is provided via a tunable degeneration network that includes an inductor in parallel with one or more switchable shunting networks. Each shunting network includes a shunting capacitor that can selectively be coupled in parallel to the inductor. A capacitance of the shunting capacitor is calculated so that a combined impedance of the inductor and the shunting capacitor at a narrowband frequency of operation is effectively an inductance. The inductance is calculated according to a desired gain of the LNA. According to one aspect, the switchable shunting network includes a resistor in series connection with the shunting capacitor to provide broadband frequency response stability of the tunable degeneration network. According to another aspect, the LNA includes a plurality of selectable branches to further control gain of the LNA.

24 Claims, 12 Drawing Sheets

Related U.S. Application Data continuation-in-part of application No. 17/503,710, filed on Oct. 18, 2021, now Pat. No. 11,870,405, which is a continuation of application No. 16/860, 739, filed on Apr. 28, 2020, now Pat. No. 11,152,907, which is a continuation of application No. 16/046, 962, filed on Jul. 26, 2018, now Pat. No. 10,673,401, which is a continuation of application No. 15/479, 173, filed on Apr. 4, 2017, now Pat. No. 10,038,418.

(51) Int. Cl.

| | |
|---|---|
| ***H03F 1/32*** | (2006.01) |
| ***H03F 3/193*** | (2006.01) |
| ***H03F 3/21*** | (2006.01) |
| ***H03F 3/72*** | (2006.01) |
| ***H03G 1/00*** | (2006.01) |
| ***H03G 3/00*** | (2006.01) |

(52) U.S. Cl.

CPC ............... *H03F 3/211* (2013.01); *H03F 3/72* (2013.01); *H03G 1/0023* (2013.01); *H03G 1/0029* (2013.01); *H03G 1/0088* (2013.01); *H03G 3/001* (2013.01); *H03F 2200/156* (2013.01); *H03F 2200/159* (2013.01); *H03F 2200/294* (2013.01); *H03F 2200/451* (2013.01); *H03F 2200/489* (2013.01); *H03F 2200/492* (2013.01); *H03F 2200/61* (2013.01); *H03F 2203/7239* (2013.01); *H03G 3/3052* (2013.01); *H03G 2201/504* (2013.01)

(58) Field of Classification Search

CPC ............ H03G 3/3052; H03G 2201/504; H03F 1/223; H03F 1/3205; H03F 3/193; H03F 3/211; H03F 3/72; H03F 2200/156; H03F 2200/159; H03F 2200/294; H03F 2200/451; H03F 2200/489; H03F 2200/492; H03F 2200/61; H03F 2203/7239; H03F 2200/267; H03F 2200/301; H03F 1/56; H03F 2200/75; H03F 3/195

USPC .......................................... 330/311, 283, 277

See application file for complete search history.

(56) References Cited

U.S. PATENT DOCUMENTS

| | | | | |
|---|---|---|---|---|
| 8,294,515 | B1 | 10/2012 | Riekki | |
| 8,330,547 | B2 | 12/2012 | Godbole | |
| 8,816,765 | B2 | 8/2014 | Rodal | |
| 9,035,697 | B2 | 5/2015 | Youssef | |
| 9,035,703 | B2 * | 5/2015 | Feng | H03F 1/565 330/311 |
| 9,154,356 | B2 | 10/2015 | Tasic | |
| 9,246,536 | B2 | 1/2016 | Caron | |
| 9,407,379 | B2 * | 8/2016 | Lau | H03D 7/1458 |
| 9,419,565 | B2 | 8/2016 | Nobbe | |
| 9,929,701 | B1 | 3/2018 | Noori | |
| 10,038,418 | B1 | 7/2018 | Ayranci | |
| 10,320,341 | B2 * | 6/2019 | Mu | H04B 1/18 |
| 10,673,401 | B2 | 6/2020 | Ayranci | |
| 11,152,907 | B2 | 10/2021 | Ayranci | |
| 11,201,595 | B2 | 12/2021 | Rogers | |
| 2004/0080372 | A1 | 4/2004 | Chen | |
| 2005/0118971 | A1 | 6/2005 | Arai | |
| 2006/0132242 | A1 | 6/2006 | Han | |
| 2008/0029753 | A1 | 2/2008 | Xu | |
| 2008/0258817 | A1 | 10/2008 | Zhou | |
| 2008/0297259 | A1 | 12/2008 | Mu | |
| 2009/0021307 | A1 | 1/2009 | Tzeng | |
| 2009/0051441 | A1 | 2/2009 | Branch | |
| 2009/0174481 | A1 | 7/2009 | Chang | |
| 2009/0289715 | A1 | 11/2009 | Sengupta | |
| 2010/0041361 | A1 | 2/2010 | Ojo | |
| 2010/0237947 | A1 | 9/2010 | Xiong | |
| 2011/0018635 | A1 | 1/2011 | Tasic | |
| 2011/0068871 | A1 | 3/2011 | Fujimoto | |
| 2012/0206204 | A1 | 8/2012 | Takagi | |
| 2012/0293250 | A1 | 11/2012 | Heikkinen | |
| 2012/0293259 | A1 | 11/2012 | Riekki | |
| 2012/0293262 | A1 | 11/2012 | Heikkinen | |
| 2012/0293265 | A1 | 11/2012 | Heikkinen | |
| 2013/0063223 | A1 | 3/2013 | See | |
| 2013/0314164 | A1 | 11/2013 | Din | |
| 2013/0315348 | A1 | 11/2013 | Tasic | |
| 2013/0316671 | A1 | 11/2013 | Stockinger | |
| 2014/0049326 | A1 | 2/2014 | Rodal | |
| 2014/0134960 | A1 | 5/2014 | Tasic | |
| 2014/0167864 | A1 | 6/2014 | Feng | |
| 2014/0170999 | A1 | 6/2014 | Aparin | |
| 2014/0240048 | A1 | 8/2014 | Youssef | |
| 2014/0266461 | A1 | 9/2014 | Youssef | |
| 2014/0333384 | A1 | 11/2014 | Gill | |
| 2015/0035600 | A1 | 2/2015 | Jin | |
| 2015/0038093 | A1 | 2/2015 | Connell | |
| 2015/0194935 | A1 | 7/2015 | Kim | |
| 2015/0341859 | A1 | 11/2015 | Youssef | |
| 2016/0036392 | A1 | 2/2016 | Bohsali | |
| 2016/0065264 | A1 | 3/2016 | Wu | |
| 2017/0070252 | A1 | 3/2017 | Fong | |
| 2017/0214391 | A1 | 7/2017 | Hedayati | |
| 2019/0020322 | A1 | 1/2019 | Ayranci | |

FOREIGN PATENT DOCUMENTS

| | | |
|---|---|---|
| KR | 20090071867 | 12/1899 |
| WO | WO2008102788 | 8/2008 |
| WO | WO2012156945 | 11/2012 |
| WO | WO2012156947 | 11/2012 |

* cited by examiner

100A

100C

200A

300A

300B

400

500

TUNABLE EFFECTIVE INDUCTANCE FOR MULTI-GAIN LNA WITH INDUCTIVE SOURCE DEGENERATION

CROSS-REFERENCE TO RELATED APPLICATIONS

The present application is a continuation of U.S. patent application Ser. No. 17/671,374, filed on Feb. 14, 2022, entitled "TUNABLE EFFECTIVE INDUCTANCE FOR MULTI-GAIN LNA WITH INDUCTIVE SOURCE DEGENERATION", the disclosure of which is incorporated herein by reference in its entirety. U.S. patent application Ser. No. 17/671,374 is a continuation in part of U.S. patent application Ser. No. 17/503,710, filed on Oct. 18, 2021, entitled "Optimized Multi Gain LNA Enabling Low Current and High Linearity Including Highly Linear Active Bypass", issued as U.S. Pat. No. 11,870,405 on Jan. 9, 2024, the disclosure of which is incorporated herein by reference in its entirety. application Ser. No. 17/503,710 is a continuation of U.S. patent application Ser. No. 16/860,739 filed Apr. 28, 2020, entitled "Optimized Multi Gain LNA Enabling Low Current and High Linearity Including Highly Linear Active Bypass", issued as U.S. Pat. No. 11,152,907 on Oct. 19, 2021, the disclosure of which is incorporated herein by reference in its entirety. application Ser. No. 16/860,739 is a continuation of U.S. patent application Ser. No. 16/046,962 filed Jul. 26, 2018, entitled "Optimized Multi Gain LNA Enabling Low Current and High Linearity Including Highly Linear Active Bypass", now U.S. Pat. No. 10,673,401, issued Jun. 2, 2020, the disclosure of which is incorporated herein by reference in its entirety. application Ser. No. 16/046,962 is a continuation of U.S. patent application Ser. No. 15/479,173 filed Apr. 4, 2017, entitled "Optimized Multi Gain LNA Enabling Low Current and High Linearity Including Highly Linear Active Bypass", now U.S. Pat. No. 10,038,418, issued Jul. 31, 2018, the disclosure of which is incorporated herein by reference in its entirety.

TECHNICAL FIELD

The present application is related to electronic radio frequency (RF) circuits, and more particularly to multi-gain low noise amplifiers (LNAs) with inductive source degeneration.

BACKGROUND

FIG. 1A shows a simplified schematic of a prior art multi-gain low noise amplifier (LNA, 100A) that may be used, for example, in a receive side of an RF system, such as, for example, an RF frontend (RFFE). In such an RF system, part of, for example, a handheld device, an RF signal received at an antenna may be provided as an input RF signal, $RFI_N$, to the LNA (100A). In turn, the LNA (100A) may amplify the input RF signal, $RFI_N$, to output a corresponding amplified output RF signal, $RF_{OUT}$. Processing (e.g., amplification) of the input RF signal, $RFI_N$, may be provided through a cascode configuration (M1, M2, a cascode arrangement, a cascode amplifier) comprising an input transistor, M1, that is in series connection with an output cascode transistor, M2. As known to a person skilled in the art, biasing of the cascode configuration (M1, M2) may be provided via (gate) biasing signals ($V_{G1}$, $V_{G2}$) provided/coupled (e.g., via one or more of, for example, inductor, resistor, transformer, switch, etc.) to gates of the transistors (M1, M2), in combination with a supply voltage, $V_{DD}$, that is coupled to a drain of the output cascode transistor, M2, through an inductor, $L_{OUT}$, and a reference ground, Gnd, that is coupled to a source of the input transistor, M1, through a degeneration inductor, $L_{DEG}$. A person skilled in the art would recognize that the input transistor, M1, is configured as a common source transistor, the output cascode transistor, M2, is configured as a common gate transistor, and the LNA configuration (100A) may be referred to as an inductively degenerated common source LNA.

With continued reference to FIG. 1A, an input match circuit to the cascode configuration (M1, M2) may include an inductor, $L_{IN}$, that couples the input RF signal, $RFI_N$, to a gate of the input transistor, M1. As known to a person skilled in the art, a value (inductance) of the (input match) inductor, $L_{IN}$, may be selected to reduce, at a desired operating frequency (e.g., a frequency band of operation) of the LNA (100A), loss of the input RF signal, $RFI_N$, when coupled to the input transistor, M1 (e.g., input return loss). Furthermore, a capacitor, $C_{IN}$, coupled between the inductor, $L_{IN}$, and the gate of the input transistor, M1, may serve as an AC coupling capacitor.

As it is well known to a person skilled in the art, the degeneration inductor, $L_{DEG}$, that is coupled to the source, S1, of the input transistor, M1, may be selected to provide an input impedance of the LNA (100A) which in combination with internal parameters (e.g., gate-to-source capacitance) of the input transistor, M1, may present a resonance at the frequency of operation of the LNA (100A). Multi-gain functionality of the LNA (100A) may be provided by changing inductance provided by the degeneration inductor, $L_{DEG}$. As shown in FIG. 1A, such inductance may be changed via a switch, $SW_{L1}$, which when closed, shorts a first inductor, $L_1$, to effectively provide an inductance of the degeneration inductor, $L_{DEG}$, that is equal to the inductance of a second inductor, $L_2$, and when open, removes the short at the first inductor, $L_1$, to effectively provide an inductance of the degeneration inductor, $L_{DEG}$, that is equal to the sum of an inductance of the first inductor, $L_1$, and the inductance of the second inductor, $L_2$. For example, for a low gain mode at a frequency (or band) of operation, the switch, $SW_{L1}$, may be open such as to couple to the source of the input transistor, M1, a degeneration inductance that is equal to the sum of inductances of $L_1$ and $L_2$, and for a high gain mode at the frequency of operation, the switch, $SW_{L1}$, may be closed such as to couple to the source of the input transistor, M1, a smaller degeneration inductance that is equal to the inductance of $L_2$.

As shown in the configuration (a) of FIG. 1B, the degeneration inductor, $L_{DEG}$, may be tunable (switchable, configurable, adjustable) to more than two inductances for provision of more than two different gains of the LNA (100A). For example, the degeneration inductor, $L_{DEG}$, shown as configuration (a) in FIG. 1B may provide four different gains by selectively coupling four different (effective) inductances to the source, S1, of the input transistor, M1, of the LNA (100A) of FIG. 1A. Starting from a high inductance that is the sum of the inductances of $L_1$, $L_2$, $L_3$ and $L_4$, for a case where all the switches ($SW_{L1}$, $SW_{L2}$, $SW_{L3}$) of the configuration (a) of FIG. 1B are open, progressively lower inductances (for progressively higher gain of the LNA) can be provided by closing, in order, one of the switches $SW_{L1}$, $SW_{L2}$ or $SW_{L3}$.

Configuration (b) of FIG. 1B shows one practical implementation of the (tunable) degeneration inductor, $L_{DEG}$, shown in the configuration (a) of FIG. 1B, wherein the high inductance that is the sum of the inductances of $L_1$, $L_2$, $L_3$ and $L_4$, is provided by one large inductor, $L_0$. Use of such large inductor may reduce any parasitic couplings that may form between the multiple separate inductors shown in the configuration (a) of FIG. 1B. Tap points ($TP_{L1}$, $TP_{L2}$, $TP_{L3}$, connections) made at various points within the winding of the large inductor, $L_0$, coupled to respective switches ($SW_{L1}$, $SW_{L2}$, $SW_{L3}$) allow selective shorting (e.g., between a tap point and a terminal of the inductor that is coupled to the source, S1) of a portion of the winding, thereby reducing an effective inductance coupled to the source, S1, of the input transistor, M1.

Controlling gain of the LNA (100A) by changing degeneration inductance (e.g., $L_{DEG}$) can impact input matching and therefore affect/degrade input return loss (e.g., S11 parameter). FIG. 1C shows one method to maintain a desired input impedance across different gain settings of the LNA (100A) by selectively introducing, via a switch, $SW_{C1}$, a capacitance provided by a capacitor, $C_1$. Such capacitance allows to compensate for a change of the input impedance to the LNA (100A) in view of a change in degeneration inductance such as to maintain the desired input return loss performance. For example, during operation in the high gain mode, the switch, $SW_{C1}$, may be open so to decouple the capacitor, $C_1$, from the source, S1, of the input transistor, M1, and during operation in the high gain mode, the switch, $SW_{C1}$, may be closed so to couple the capacitor, $C_1$, between the gate and the source, S1, of the input transistor, M1.

Although the tunable degeneration inductor, $L_{DEG}$, described above with reference to FIG. 1A and FIG. 1B allows multi-gain operation of the LNA (100A) by coupling/decoupling different inductances provided by inductor windings, there are some disadvantages in using it. For example, the large inductance provided by the inductor $L_0$ shown in FIG. 1B may require a relatively large die area which may impact size and cost of the LNA (100A). Furthermore, such large inductance, and therefore large inductor, $L_0$, may impact a Q-factor of the inductor, and therefore may degrade a noise figure (i.e., signal-to-noise figure) performance of the LNA (100A), and therefore a sensitivity of the LNA (100A) which may be required for operation at high gain modes. Similarly, degradation of the noise figure performance of the LNA (100A), and therefore sensitivity, may be provided by the insertion loss introduced by the one or more switches (e.g., $SW_{E1}$, $SW_{E2}$, $SW_{E3}$) used to tune the effective degeneration inductance (e.g., $L_{DEG}$), or the switch $SW_{C1}$ used in the tuning of the input impedance to the LNA (100A).

Teachings according to the present disclosure describe devices and methods for implementing a tunable degeneration inductance for a multi-gain LNA with inductive source degeneration that overcome the above-described shortcomings of the prior art.

SUMMARY

According to a first aspect of the present disclosure, a multi-gain low noise amplifier (LNA) is presented, comprising: a cascode arrangement comprising an input transistor and an output cascode transistor; and a tunable degeneration network having a first terminal connected to a source of the input transistor and a second terminal connected to a reference ground, the tunable degeneration network comprising: a fixed inductance inductor connected between the first terminal and the second terminal; and a first switchable shunting network connected between the first terminal and the second terminal, the first switchable shunting network comprising: a first switch in series connection with a first capacitor, wherein a capacitance of the first capacitor is selected so that at a frequency band of operation of the multi-gain LNA, a parallel combination of the fixed inductance inductor and the first capacitor results in a first parallel combined inductive impedance that is larger than an inductive impedance of the fixed inductance inductor.

According to a second aspect of the present disclosure, a method for providing a tunable inductance for a multi-gain low noise amplifier (LNA) is presented, the method comprising: providing a first switchable shunting network comprising a first switch in series connection with a first capacitor; connecting the first switchable shunting network between first and second terminals of a fixed inductance inductor; connecting the first terminal to a source of an input transistor of the multi-gain LNA; and connecting the second terminal to a reference ground, wherein a capacitance of the first capacitor is selected so that at a frequency band of operation of the multi-gain LNA, a parallel combination of the fixed inductance inductor and the first capacitor results in a parallel combined inductive impedance that is larger than an inductive impedance of the fixed inductance inductor.

Further aspects of the disclosure are provided in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Teachings according to the present disclosure overcome the above-described shortcoming by eliminating the need for multiple inductors (e.g., $L_1, \ldots, L_4$ of FIG. 1B) or a large inductor (e.g., $L_0$ of FIG. 1B) for implementing a tunable degeneration inductor. Rather, teaching according to the present disclosure use a single smaller inductor for a high-gain mode (of operation) of the LNA, and one or more switchable shunting capacitors to effectively provide, at a frequency (band) of operation of the LNA, one or more additional low-gain modes when combined with the single smaller inductor. As will be later described, parallel coupling of the single smaller inductor with a switched-in shunted capacitor can provide a combined impedance (e.g., a parallel combined inductive impedance) that at the frequency (band) of operation could be effectively inductive (i.e., inductive impedance, pure imaginary impedance of the form $Z(\omega)=jL\omega$, L being a positive real number, or of the approximative form $Z(\omega)=R+jL\omega$ with a ratio of $L\omega/R$ being large). Accordingly, the LNA according to the present disclosure may operate as an inductively degenerated common source LNA using a tunable (e.g., switchable, configurable, adjustable) degeneration network (i.e., impedance thereof) that at the frequency of operation could be effectively (e.g., behaves like) an inductor (therefore has an inductive impedance and can be likened to an inductor or an effective inductor), wherein, as shown in FIG. 2A, the tuning is provided not by switching in/out inductors, but rather capacitors (i.e., $C_{L1}$).

Figure 1A:
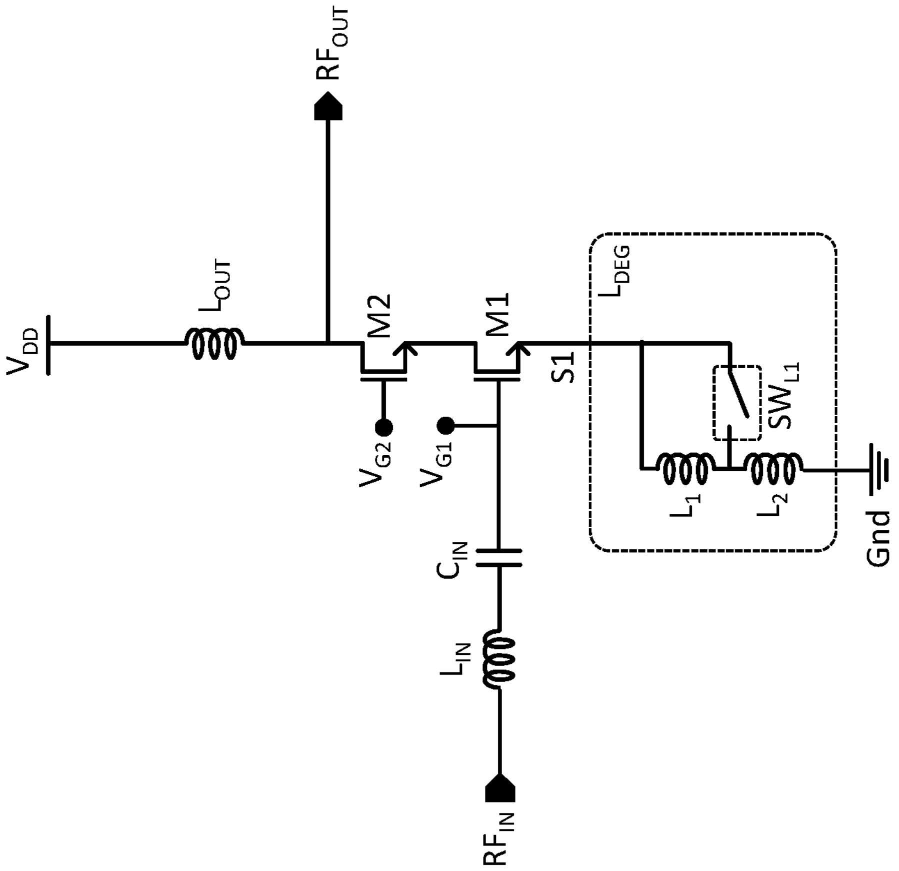
Prior Art FIG. 1A
FIG. 1A shows a simplified schematic of a prior art multi-gain low noise amplifier (LNA) with inductive source degeneration.
Figure 1B:
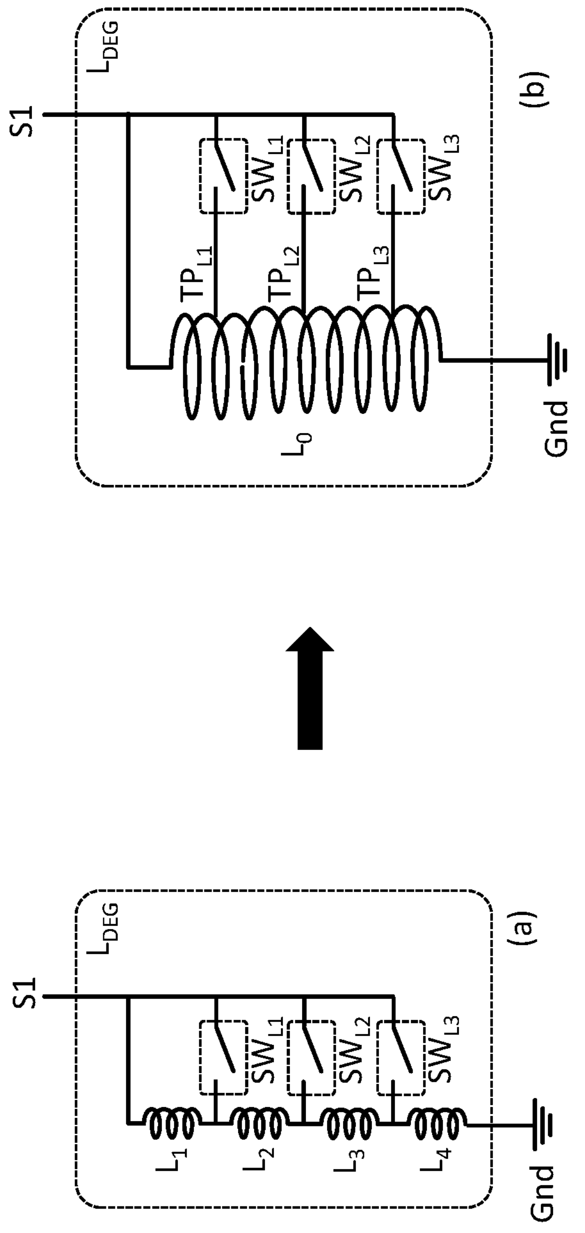
FIG. 1B shows two different configurations of a tunable degeneration inductor that may be used in the LNA of FIG. 1A.
Figure 1C:
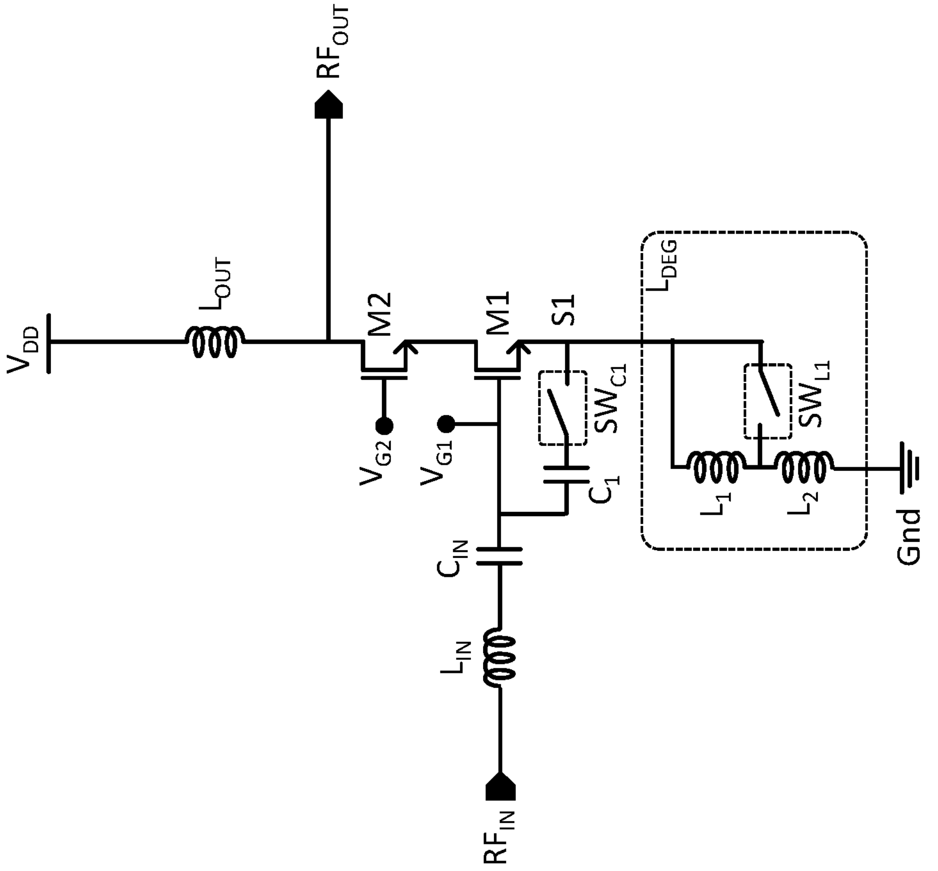
FIG. 1C shows a simplified schematic of a multi-gain low noise amplifier (LNA) with inductive source degeneration and a tunable capacitance to maintain input return loss of the LNA.
Figure 2A:
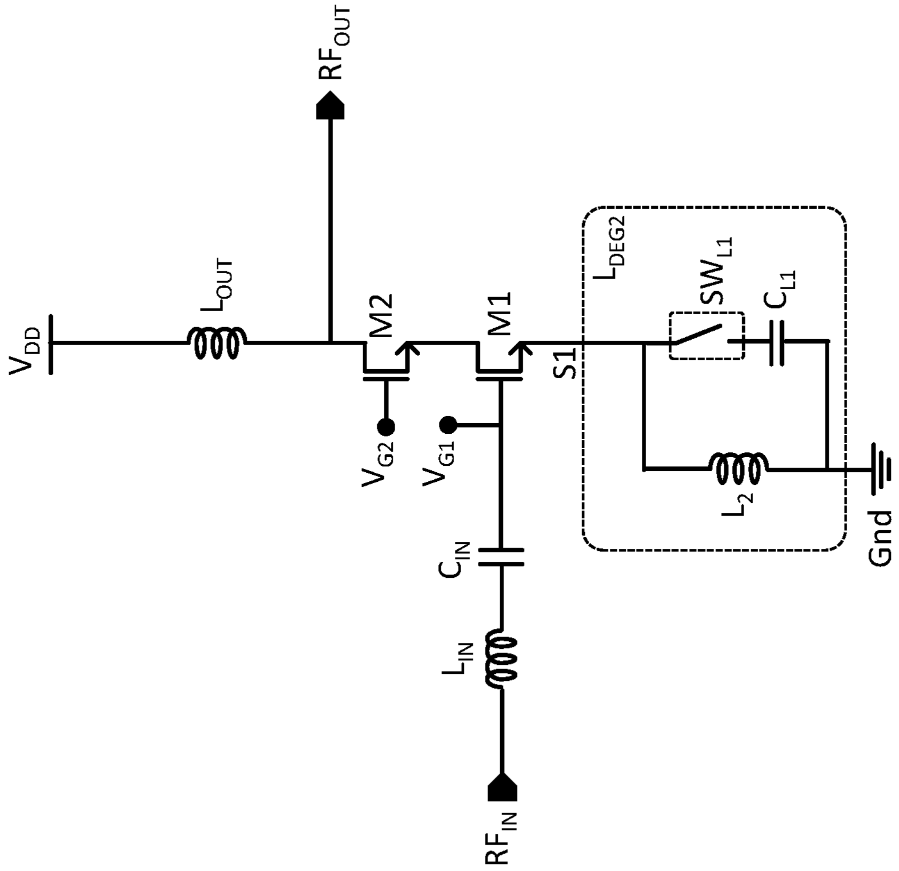
FIG. 2A shows a simplified schematic of a multi-gain low noise amplifier (LNA) with inductive source degeneration according to an embodiment of the present disclosure.

FIG. 2A shows a simplified schematic of a multi-gain low noise amplifier (LNA, 200A) with inductive source degeneration according to an embodiment of the present disclosure. As shown in FIG. 2A, the inductive source degeneration may be provided by a (tunable) degeneration network, $L_{DEG2}$, that comprises an inductor, $L_2$, in parallel with a switchable shunting network ($SW_{L1}$, $C_{L1}$) comprising a capacitor, $C_{L1}$, in series connection with a switch, $SW_{L1}$. The LNA (200A) shown in FIG. 2A may include two gain modes; a high gain mode provided via an inductance of the inductor, $L_2$, when the switch, $SW_{L1}$, is open; and a low-gain mode provided via an effective inductance of the parallel combination of the inductor, $L_2$, and the capacitor, $C_{L1}$, when the switch, $SW_{L1}$, is closed. Such effective inductance being larger, at the frequency of operation of the LNA (200A), than the inductance of the inductor, $L_2$, and can therefore provide a lower gain of the LNA (200A). It should be noted that the inductor $L_2$ shown in FIG. 2A has a fixed inductance and may therefore be referred to as a "fixed inductance inductor", in contrast to a tunable/adjustable/variable/configurable/changeable/settable inductance inductor, such as one provided by the degeneration inductor, $L_{DEG}$, shown in FIGS. 1A-1C, which includes switches. Teachings according to the present disclosure use a fixed inductance inductor in combination with one or more switchable shunting networks (e.g., $SW_{L1}$, $C_{L1}$) to effectively provide different inductances at the frequency (band) of operation of the LNA (e.g., 200A of FIG. 2A).

When comparing to the multi-gain operation of the prior art LNA (100A) of FIG. 1A, the low gain mode of operation of the LNA (200A) of FIG. 2A is provided not by an inductance of series-connected inductors $L_1$ and $L_2$ of the LNA (100A), rather by an impedance of the parallel combination of the inductor, $L_2$, with an impedance of the switchable shunting network ($SW_{L1}$, $C_{11}$), that at the frequency (band) of operation is effectively equal to the inductance of series-connected inductors $L_1$ and $L_2$ of the LNA (100A). Although the broadband frequency response of the degeneration network, $L_{DEG}$, used in the LNA (100A) may be different from the broadband frequency response of the degeneration network, $L_{DEG2}$, of the present teachings that is used in the LNA (200A), capacitance of the capacitor, $C_{L1}$, may be calculated such as within a narrowband frequency range, $L_{DEG}$ and $L_{DEG2}$ have similar (essentially equal) frequency responses, such narrowband being equal to, or encompassing, the frequency band of operation of the LNAs. As used herein, the term "narrowband" may refer to a frequency range based on a bandwidth of operation of an amplifier, such as the LNA (200A), In particular, as used herein, a narrowband frequency range may refer to a frequency range that is smaller than 25% of the center frequency of the frequency range.

For a case where the frequency band of operation of the LNA (200A) of FIG. 2A is a narrowband frequency range centered about a center frequency of $f_1$, and an angular frequency of $\omega_1=2\pi f_1$, calculation of the capacitance of the capacitor, $C_{L1}$, of the (tunable) degeneration network, $L_{DEG2}$, may be derived from the following equation (1):

$$j\omega_1(L_1+L_2) = \frac{j\omega_1 L_2\left(\frac{1}{j\omega_1 C_{L1}}\right)}{j\omega_1 L_2 + \left(\frac{1}{j\omega_1 C_{L1}}\right)} \quad \text{equation (1)}$$

which can be solved to obtain the following equation (2):

$$C_{L1} = \frac{L_1}{\omega_1^2 L_2(L_1+L_2)} \quad \text{equation (2)}$$

In other words, by selecting the capacitance $C_{L1}$ according to the equation (2), the LNA (100A) of FIG. 1A and the LNA (200A) of FIG. 2A can provide a same low gain at the respective low gain mode of operation within the frequency band of operation defined by the center frequency, $f_1$.

With further reference to FIG. 2A, in the high gain mode of operation, the switch, $SW_{L1}$, of the switchable shunting network ($SW_{L1}$, $C_{L1}$) is open, thereby decoupling the shunting capacitor, $C_{L1}$, from the source, S1, of the input transistor, M1. Accordingly, the source, S1, may see a parasitic capacitance corresponding to a switched off state of the switchable shunting network ($SW_{L1}$, $C_{L1}$), which may be based on, for example, an OFF capacitance of the switch, $SW_{L1}$. On the other hand, in the low gain mode of operation, the switch, $SW_{L1}$, of the switchable shunting network ($SW_{L1}$, $C_{L1}$) is closed thereby coupling the shunting capacitor, $C_{L1}$, to the source, S1, of the input transistor, M1. In this case, the series combination of the capacitance of the capacitor, $C_{L1}$, with an ON resistance of the switch, $SW_{L1}$, may provide an impedance that when combined with the inductance of the inductor, $L_2$, result in a Q-factor that is lower (e.g., detuned) than one obtained by the two parallel inductors (e.g., $L_1$ and $L_2$ of FIG. 1A). Applicant of the present disclosure has established that any negative impact of the above-described parasitic capacitance in the high gain mode of operation, and/or of the above-described lower Q-factor in the low gain mode of operation, on overall performance of the LNA (200A) may be negligible at the targeted (narrowband) frequencies of operation of the LNA (200A). Furthermore, it should be noted that lowering of the Q-factor via the parallel coupling of the impedance of the switchable shunting network ($SW_{L1}$, $C_{L1}$) to the inductor $L_2$ during the low gain mode of operation can be used as a means to further increase bandwidth of operation of the LNA (200A), since the lower Q-factor obtained can increase the bandwidth of operation. On the other hand, impact of the above-described parasitic capacitance in the high gain mode of operation, and/or of the above-described lower Q-factor in the low gain mode of operation, on a broadband frequency response of the tunable degeneration network according to the present teachings (e.g., $L_{DEG2}$ of FIG. 2A), and means for improved stability (e.g., unconditional stability) are described below with reference to FIG. 2C and FIG. 2D.

The multi-gain LNA with inductive source degeneration according to the present disclosure may include more than two gain modes achieved by more than two (effective) degeneration inductances selectively coupled to the source, S1, of the input transistor, M1, of FIG. 2A. Such gain modes may be provided by a tunable degeneration network similar to one described above with reference to FIG. 2A, comprising (not two, but) a plurality of parallel switchable shunting networks, each similar to the switchable shunting network ($SW_{L1}$, $C_{L1}$) of FIG. 2A. This is shown in the tunable degeneration network, $L_{DEG}$ 3, of FIG. 2B (right side of the figure) which provides four gain modes via three switchable shunting networks ($SW_{L3}$, $C_{L3}$), ($SW_{L23}$, $C_{L23}$) and ($SW_{L13}$, $C_{L13}$), each arranged in parallel with an inductor, $L_4$.

Figure 2B:
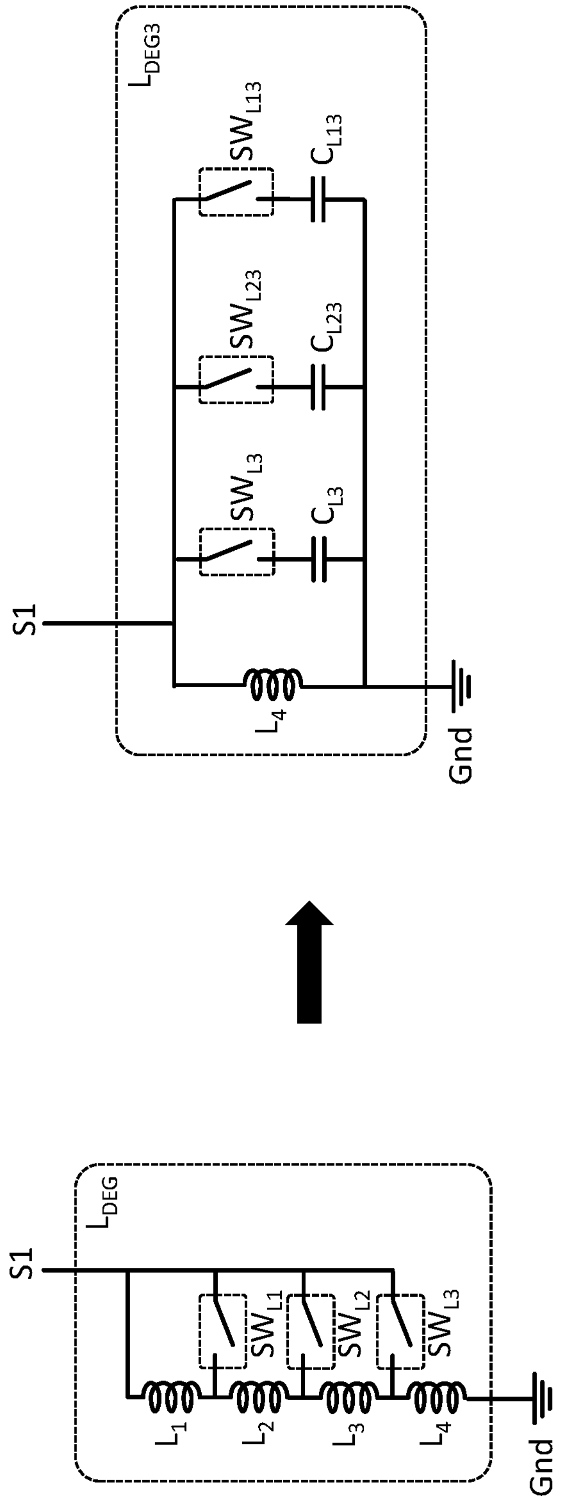
FIG. 2B shows a prior art tunable degeneration inductor and a tunable degeneration network according to an embodiment of the present disclosure.

With continued reference to the tunable degeneration network, $L_{DEG3}$, of FIG. 2B (right side of the figure), a high gain mode, referred to as for example a first gain mode, may be provided via an inductance of the (fixed inductance) inductor, $L_4$, when all of the switches ($SW_{L1}$, $SW_{L23}$, $SW_{L13}$) are open; a lower-gain mode, referred to as for example a second gain mode, provided via an effective inductance of the parallel combination of the inductor, $L_4$, and the capacitor, $C_{L3}$, when the switch, $SW_{L3}$, is closed and all the other switches are open. Such effective inductance being larger, at the frequency of operation of the LNA (200A) than the inductance of the inductor, $L_4$, and can therefore provide a lower gain than the first gain mode; a yet lower gain mode, referred to as for example a third gain mode, provided via an effective inductance of the parallel combination of the inductor, $L_4$, and the capacitor, $C_{L23}$, when the switch, $SW_{L23}$, is closed and all the other switches are open. Such effective inductance being larger, at the frequency of operation of the LNA (200A) than the effective inductance of the second gain mode, and can therefore provide a lower gain (assuming that the capacitance of $C_{L23}$ is larger than the capacitance of Cu); and a lowest gain mode, referred to as for example a fourth gain mode, provided via an effective inductance of the parallel combination of the inductor, $L_4$, and the capacitor, $C_{L13}$, when the switch, $SW_{L13}$, is closed and all the other switches are open. Such effective inductance being larger, at the frequency of operation of the LNA (200A) than the effective inductance of the third gain mode and can therefore provide a lowest gain (assuming that the capacitance of $C_{L13}$ is larger than the capacitances of $C_{L23}$ and Cu). It should be noted that other values of effective inductances, and corresponding gain modes, may be provided by having, for any one of the supported gain modes, more than one of the switches ($SW_{L1}$, $SW_{L23}$, $SW_{L13}$) closed at one time, wherein closing of a switch may provide an additional capacitance that may be added to capacitances provided by other closed switches (e.g., all capacitances may be of equal values). This in turn may provide the advantage to generate larger capacitances via a plurality of smaller capacitors so to minimize capacitor die area while providing flexibility in gain selection. As such, any additional closing of a switch may increase an effective combined capacitance and therefore may effectively provide a lower gain (step).

With continued reference to FIG. 2B, each of the capacitances (e.g., $C_{L3}$, $C_{L23}$, $C_{L13}$) of the three switchable shunting networks ($SW_{L3}$, $C_{L3}$), ($SW_{L23}$, $C_{L23}$) and ($SW_{L13}$, $C_{L13}$) may be calculated via the equations (1) and (2) described above by replacing the inductance $L_2$ with the inductance $L_4$; the capacitance Cu with a target capacitance to be calculated $C_{L3}$, $C_{L23}$ or $C_{L13}$; and the inductance $L_1$ with a corresponding (equivalent) target inductance in series connection with $L_4$. For example, to provide gains similar to ones provided by the tunable degeneration network, $L_{DEG}$, of FIG. 2B (left side of the figure), each of the capacitances $C_{L3}$, $C_{L23}$ or $C_{L13}$ may be calculated by respectively considering the inductance $L_1$ of the equations (1) and (2) equal to $L_3$, ($L_2$+$L_3$) or ($L_1$+$L_2$+$L_3$).

Although operation of the tunable degeneration network (e.g., $L_{DEG2}$ of FIG. 2A, $L_{DEG}$ 3 of FIG. 2B) according to the present disclosure for provision of various gain modes of the LNA (200A of FIG. 2A) may be in view of a narrowband frequency response of the network, in some cases consideration for a broadband frequency response of the network may be desirable or even required. This may be in view, for example, of a requirement of the network over a broadband frequency range to prevent instabilities/oscillations when the LNA is subjected to various (even unexpected) input and/or output load conditions. Teachings according to the present disclosure allows for designing of a tunable degeneration network that is resilient to instabilities and may satisfy unconditional stability (i.e., stable without oscillation at all frequencies irrespective of input/output loads). This may be provided by detuning elements (e.g., detuning resistor $R_{L1}$, $R_{L3}$, $R_{L23}$ or $R_{L13}$ of FIG. 2C, or detuning network $R_{dQ}$, $C_{dQ}$ of FIG. 2D, aimed at lowering a corresponding Q-factor) introduced within, or coupled to, the tunable degeneration network according to the present disclosure described above with reference to FIG. 2A and FIG. 2B.

Figure 2C:
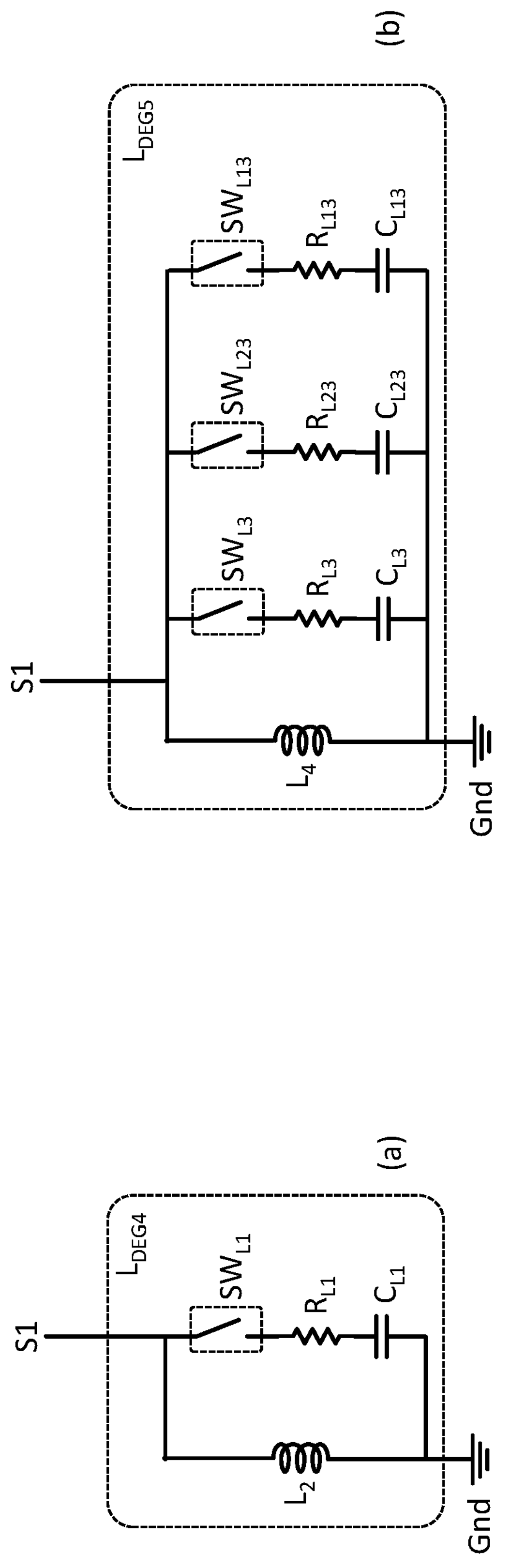
FIG. 2C shows exemplary tunable degeneration networks according to an embodiment of the present disclosure for increased broadband frequency response stability at low gain modes.

FIG. 2C shows exemplary tunable degeneration networks $L_{DEG4}$ and $L_{DEG5}$ according to an embodiment of the present disclosure with increased broadband frequency response stability at low gain modes provided via detuning resistors $R_{L1}$, $R_{L3}$, $R_{L23}$ and $R_{L13}$ inserted in series connection with the respective switchable shunting networks ($SW_{L1}$, $C_{L1}$), ($SW_{L3}$, $C_{L3}$) ($SW_{L23}$, $C_{L23}$) and ($SW_{L13}$, $C_{L13}$). A person skilled in the art will clearly realize that tunable degeneration networks $L_{DEG4}$ and $L_{DEG5}$ shown in FIG. 2C respectively correspond to the above-described tunable degeneration networks $L_{DEG2}$ (of FIG. 2A) and $L_{DEG3}$ (of FIG. 2B) with the added detuning resistors for increased stability during operation in the low gain modes (e.g., when a switchable shunting network is activated to effectively provide a shunting capacitance).

During operation in the low gain mode, the switch, $SW_{L1}$, of the tunable degeneration network, $L_{DEG4}$, of FIG. 2C, is closed, and therefore the combination of the shunting capacitor, $C_{L1}$, in series connection with the ON resistance of the switch, $SW_{L1}$, and the inductor, $L_2$, provide a resonant circuit that may include a resonance frequency that is substantially lower (e.g., by a factor of 3 to 5 times) than a self-resonance frequency of the inductor, $L_2$. Inclusion of the detuning resistor, Ru, allows detuning of the resonant circuit, or in other words, lowering of the Q-factor of the resonant circuit for increased (broadband) frequency response stability. It should be noted that any signal attenuation caused by the detuning resistor, Ru, and therefore possible degradation in noise figure performance, may be considered acceptable during operation in the low gain mode (as an input RF signal to the LNA is assumed of a relatively larger amplitude/power). In other words, benefits with respect to the broadband frequency response stability gained via insertion of the detuning resistor, Ru, may outweigh any drawbacks with respect to the possible degradation of the noise figure performance. Effects of the detuning resistors $R_{L3}$, $R_{L23}$ and $R_{L13}$ on broadband frequency response of the tunable degeneration network $L_{DEG5}$ are similar to the above-described detuning of the resonant circuit for the case of the tunable degeneration network $L_{DEG4}$, but considering respective resonant circuits provided for the various low gain modes by the respective switchable shunting networks ($SW_{L3}$, $C_{L3}$) ($SW_{L23}$, $C_{L23}$) or ($SW_{L13}$, $C_{L13}$). It should be noted that insertion of the detuning resistors Ru, $R_{L3}$, $R_{L23}$ and $R_{L13}$ in the respective switchable shunting networks ($SW_{L1}$, $C_{L1}$), ($SW_{L3}$, $C_{L3}$) ($SW_{L23}$, $C_{L23}$) and ($SW_{L13}$, $C_{L13}$) of the tunable degeneration networks $L_{DEG4}$ and $L_{DEG5}$ of FIG. 2C may not negate validity of the above-described equations (1) and (2), as insertion of such resistors may have a negligible effect on calculation of the impedances at the narrowband frequency of operation (e.g., at the center frequency $f_1$). It should be noted that in some embodiments, a value of the detuning resistor (e.g., Ru) may be selected to be as large as possible to obtain/guarantee broadband frequency response stability while meeting noise figure specifications.

During operation in the high gain mode, the switch, $SW_{L1}$, of the tunable degeneration network, $L_{DEG4}$, of FIG. 2C, is open, thereby decouples the shunting capacitor, $C_{L1}$, from the source, S1, of the input transistor (e.g., M1 of FIG. 2A). Accordingly, the source, S1, may see a parasitic capacitance corresponding to a switched off state of the switchable shunting network ($SW_{L1}$, $C_{L1}$), which may be based on, for example, an OFF capacitance of the switch, $SW_{L1}$. Applicant of the present disclosure have established that presence of such parasitic capacitance may have a negligible effect on broadband frequency response of the tunable degeneration network, $L_{DEG4}$. In other words, the broadband frequency response of the tunable degeneration network, $L_{DEG4}$, may be estimated to be same as the broadband frequency response of the inductor, $L_2$. Same reasoning, effect and estimation may be applied to the high gain mode of operation of the tunable degeneration network, $L_{DEG5}$, of FIG. 2C, while considering the combined OFF capacitances of the switches ($SW_{L3}$, $SW_{L23}$, $SW_{L13}$) as the parasitic capacitance presented to the source, S1, and the inductor $L_4$ as the dominant element for consideration of the broadband frequency response. Accordingly, detuning of the resonance of the tunable degeneration networks $L_{DEG4}$ (and $L_{DEG5}$) of FIG. 2C may be provided by a detuning network coupled in parallel to the respective inductor $L_2$ (and $L_4$), as shown in the tunable degeneration networks $L_{DEG6}$ of FIG. 2D.

Figure 2D:
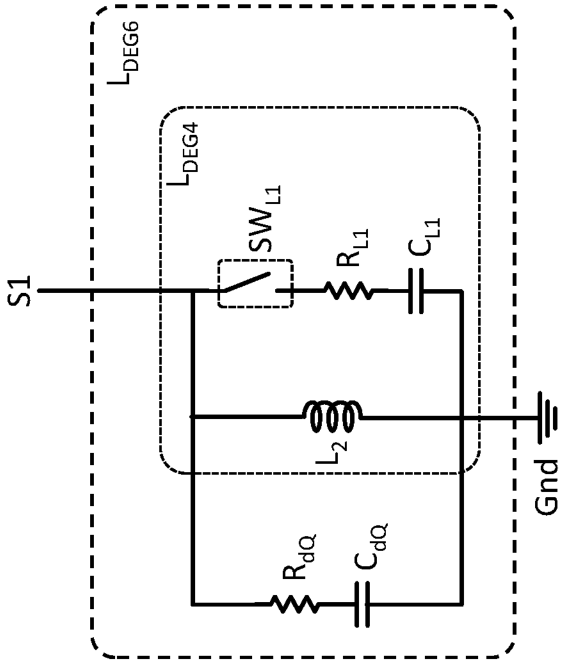
FIG. 2D shows an exemplary tunable degeneration network according to an embodiment of the present disclosure for increased broadband frequency response stability at low gain and high gain modes.

FIG. 2D shows an exemplary tunable degeneration network, $L_{DEG6}$, according to an embodiment of the present disclosure with increased (improved) broadband frequency response stability at low gain and high gain modes. A person skilled in the art would recognize that the tunable degeneration network, $L_{DEG6}$, is based on the tunable degeneration network, $L_{DEG4}$, described above with reference to FIG. 2C, with the addition of a detuning network ($R_{dQ}$, $C_{dQ}$) in parallel connection with the inductor, $L_2$. In such configuration, the detuning network ($R_{dQ}$, $C_{dQ}$) may provide increased broadband frequency response stability at high gain mode of the tunable degeneration network, $L_{DEG6}$, and the detuning resistor, $R_{L1}$, may provide increased broadband frequency response stability at low gain mode of the tunable degeneration network, $L_{DEG6}$. According to an embodiment of the present disclosure, a capacitance of the capacitor, $C_{dQ}$, may be selected such as at higher frequencies (frequency region where unconditional stability may be an issue), the impedance associated with such capacitance is negligible compared to the resistance of the resistor, $R_{dQ}$, and therefore, the detuning network ($R_{dQ}$, $C_{dQ}$) may be equivalent to a resistor that can detune the degeneration network, $L_{DEG4}$, when the switch $SW_{L1}$ is open. In other words, the detuning network ($R_{dQ}$, $C_{dQ}$) is configured to detune (i.e., lower the Q-factor) of the inductor, $L_2$, based on a ratio of its inductive reactance to its resistance at broadband frequencies. Although not shown in FIG. 2C, a detuning network similar to the detuning network ($R_{dQ}$, $C_{dQ}$) may be provided in a parallel connection with the inductor, $L_4$, of the tunable degeneration network, $L_{DEG5}$, of FIG. 2C for increased broadband frequency response stability at a high gain mode.

Figure 3A:
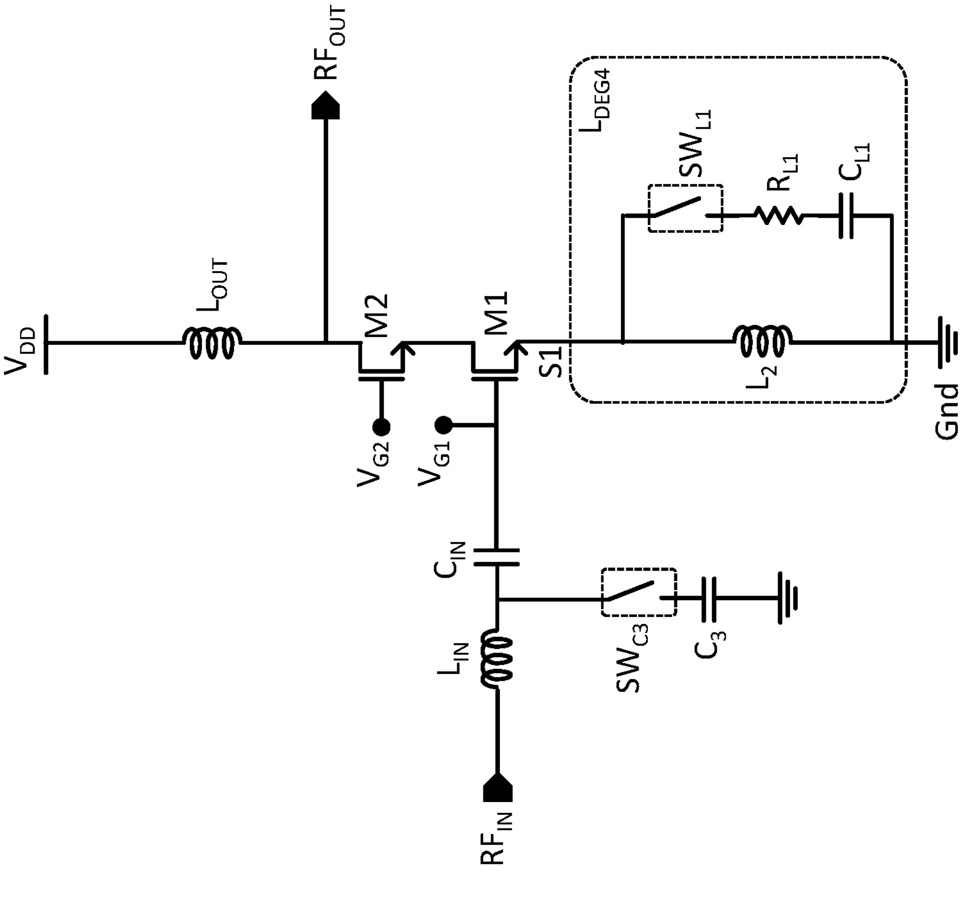
FIG. 3A shows a switchable input compensation network according to an embodiment of the present disclosure coupled to the multi-gain low noise amplifier (LNA) with inductive source degeneration based on FIG. 2A and FIG. 2C.

FIG. 3A shows an LNA configuration (300A) comprising a switchable input impedance compensation network ($SW_{C3}$, $C_3$) according to an embodiment of the present disclosure coupled to the multi-gain low noise amplifier (LNA) with inductive source degeneration of FIG. 2A (with the tunable degeneration network, $L_{DEG4}$, of FIG. 2C). The switchable input impedance compensation network ($SW_{C3}$, $C_3$) may serve same purpose as the network ($SW_{C1}$, $C_1$) described above with reference to FIG. 1C, i.e., to maintain a desired input return loss performance across different gain settings of the LNA configuration (300A). However, instead of performing such task by selectively introducing a capacitance that is in parallel with a gate-to-source (parasitic/internal) capacitance of the input transistor, M1, per the configuration of FIG. 1C, the configuration of FIG. 3A performs the task of maintaining the desired input return loss performance by selectively introducing, via the switch, $SW_{C3}$, a capacitance provided by a capacitor, $C_3$, that is in parallel with an input impedance (seen at the gate) of the input transistor, M1. It should be noted that the LNA configuration (300A) shown in FIG. 3A may not be restricted to the shown tunable degeneration networks, $L_{DEG4}$, as any of the tunable degeneration networks, $L_{DEG2}$, $L_{DEG3}$, $L_{DEG4}$, $L_{DEG5}$, or $L_{DEG6}$ may be used in conjunction with the input impedance compensation network ($SW_{C3}$, $C_3$) for implementation of a multi-gain LNA with inductive source degeneration. Furthermore, it should be noted that the LNA configuration (300A), as well as any other LNA configuration according to the present teachings, may not be limited to a cascode configuration (e.g., M1, M2) having (only) two serially connected (stacked) transistors, as any transistor configuration including a single common source transistor as well as cascode configurations with one or more cascode transistors (in addition to an input transistor, e.g., M1) may be equally used, in dependence to, for example, a level of the supply voltage, $V_{DD}$, and voltage withstand capabilities of the transistors (e.g., M1, M2) used in the cascode configuration.

With continued reference to FIG. 3A, during operation in the high gain mode, the switch, $SW_{C3}$, may be open such as to decouple the capacitor, $C_3$, from (the gate of) the input transistor, M1, and during operation in the low gain mode, the switch, $SW_{C3}$, may be closed such as to couple the capacitor, $C_3$, between (the gate of) the input transistor, M1, and the reference ground, Gnd, which effectively modifies the input impedance of the LNA (300A) to maintain a matching with the input match circuit, $L_{IN}$, at the frequency band of operation (and therefore maintain a desired input return loss). In contrast to the network ($SW_{C1}$, $C_1$) described above with reference to FIG. 1C which at all time presents a load to the source, S1, of the input transistor, including during operation in the high gain mode, the switchable input impedance compensation network ($SW_{C3}$, $C_3$) of FIG. 3A does not present a load (off capacitance of a switch) to the source, S1, thereby providing an improved noise figure performance when compared to the configuration of FIG. 1C.

Figure 3B:
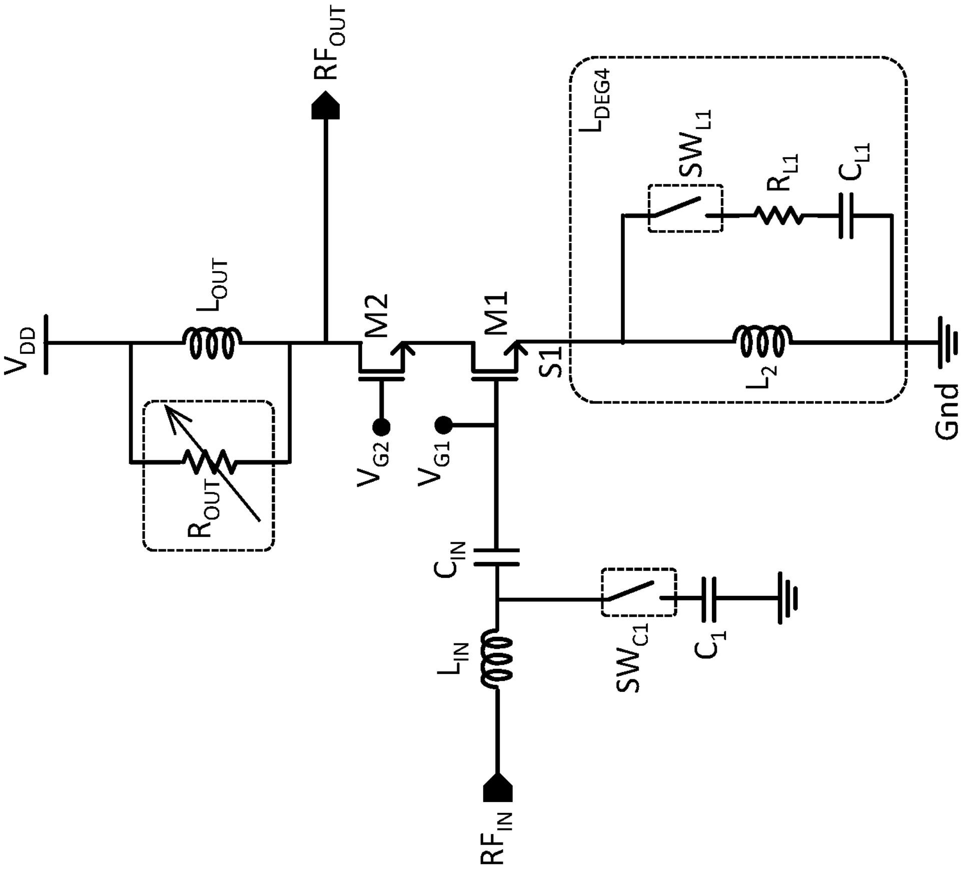
FIG. 3B shows a variation of the configuration shown in FIG. 3A with added gain control capability.

FIG. 3B shows a variation of the LNA shown in FIG. 3A with added gain control capability provided via a load resistor, R OUT. As shown in FIG. 3B, the load resistor, $R_{OUT}$, of the LNA (300B) may be coupled in parallel with the (load) inductor, $L_{OUT}$. In other words, the load resistor, $R_{OUT}$, may be coupled between a drain of the output cascode transistor, M2, and the supply voltage, $V_{DD}$. Increasing a resistance of the load resistor, ROUT, may decrease gain of the LNA (300B). By providing a load resistor, R OUT, having an adjustable (e.g., variable, selectable, tunable) resistance as shown in FIG. 3B, a lower gain than one achieved by the low gain mode provided by the tunable degeneration network (e.g., $L_{DEG4}$) coupled to the source, S1, of the input transistor, M1, may be achieved. It should be noted that the LNA configuration (300B) shown in FIG. 3B may not be restricted to the shown tunable degeneration networks, $L_{DEG4}$, as any of the tunable degeneration networks, $L_{DEG2}$, $L_{DEG3}$, $L_{DEG4}$, $L_{DEG5}$, or $L_{DEG6}$ may be used in conjunction with the load resistor, $R_{OUT}$. Furthermore, it should be noted that the LNA configuration (300B) shown in FIG. 3B may not be restricted to include the input impedance compensation network ($SW_{C3}$, $C_3$).

Figure 4:
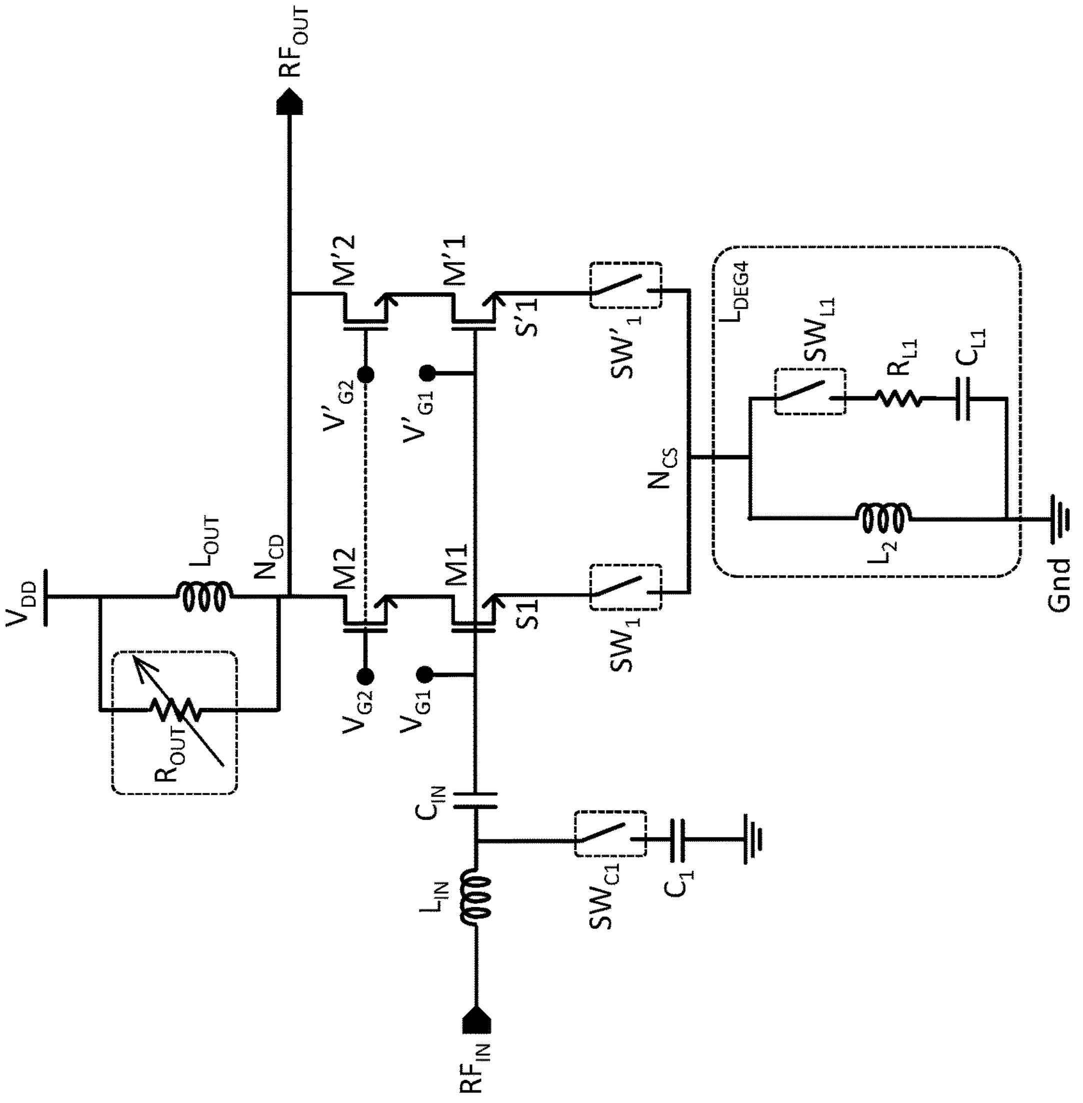
FIG. 4 shows a simplified schematic of a multi-branch multi-gain LNA according to an embodiment of the present disclosure.

FIG. 4 shows a simplified schematic of a multi-branch multi-gain LNA (400) according to an embodiment of the present disclosure that is based on the (single branch) multi-gain LNAs described above with reference to FIGS. 2A-3B. In particular, a person skilled in the art would recognize that the LNA (400) includes the LNA configuration (300B) of FIG. 3B, wherein the associated cascode configuration (M1, M2) makes up one of two amplification branches of the multi-branch multi-gain LNA (400), to which an additional amplification branch comprising a cascode configuration (M'1, M'2) and related biasing voltages ($V'_{G1}$ and $V'_{G2}$ which may be same as, or different from, $V_{G1}$ and $V_{G2}$) is added. Furthermore, as can be seen in FIG. 4, a gate of an input transistor, M'1, of the additional amplification branch is coupled/connected to a gate of the input transistor, M1, for receiving of the input RF signal, $RFI_N$. Drain of an output cascode transistor, M'2, of the additional amplification branch is coupled to the drain of the output transistor, M2, at a common drain output node, $N_{CD}$.

The multi-branch multi-gain LNA (400) of FIG. 4 is configured to amplify the input RF signal, $RFI_N$, via any one or both of the cascode configurations (M1, M2) and/or (M'1, M'2), and output a corresponding amplified signal, $RF_{OUT}$, at the common drain output node, $N_{CD}$. Branch selection for amplification (or not) via one or both of the cascode configurations (M1, M2) and/or (M'1, M'2) may be provided via respective switches $SW_1$ and $SW'_1$ in series connection between respective source nodes, S1 and S'1, of the respective input transistors, M1 and M'1, and a tunable degeneration network (e.g., $L_{DEG4}$). When a switch $SW_1$ or $SW'_1$ is open, an associated cascode configuration (M1, M2) or (M'1, M'2) is deactivated as no current conduction path between the supply voltage, $V_{DD}$, and the reference ground, Gnd, through the associated cascode configuration is provided. On the other hand, when the switch $SW_1$ or $SW'_1$ is closed, an associated cascode configuration (M1, M2) or (M'1, M'2) is activated as a current conduction path between the supply voltage, $V_{DD}$, and the reference ground, Gnd, through the associated cascode configuration is provided.

Figure 5:
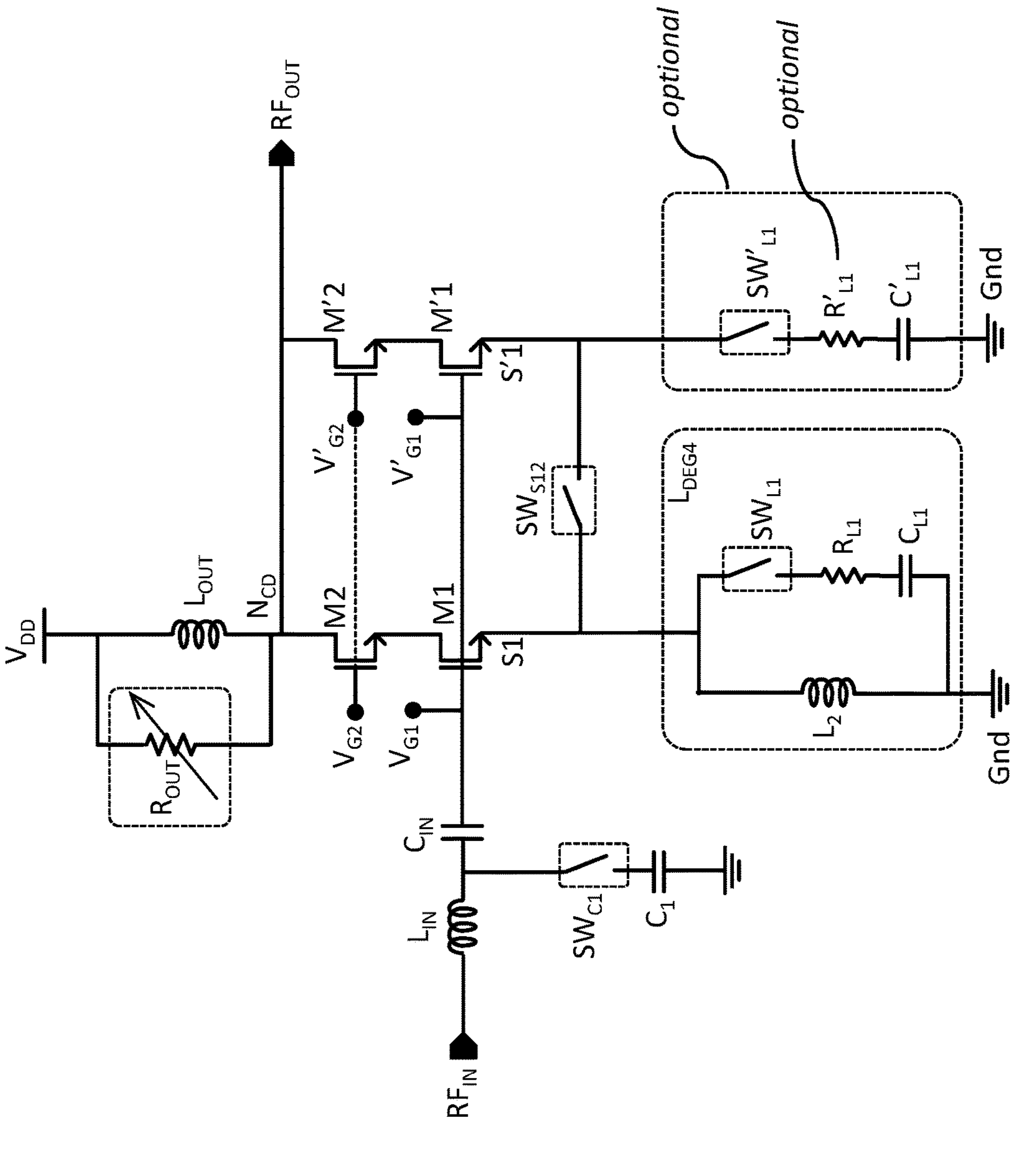
FIG. 5 shows a simplified schematic of a multi-branch multi-gain LNA according to another embodiment of the present disclosure.

With continued reference to FIG. 4, principle of operation of the various elements described above with reference to FIGS. 2A-3B remain the same. In other words, for a given configuration of the switches SW1 and SW'1, the combination of the two branches can be likened to a single cascode configuration with a different gain, to which the tunable degeneration network (e.g., $L_{DEG4}$) is coupled at a common source node, $N_{CS}$. Advantages provided by such configuration includes added handles for controlling gain of the LNA, including, degeneration inductance via the tunable degeneration network (any one of $L_{DEG2}$, $L_{DEG3}$, $L_{DEG4}$, $L_{DEG5}$ or $L_{DEG6}$), output load via the (adjustable) load resistor, R OUT, and varying/adjustable branch depth via one or more of the additional elements (SW'1, M'1, M'2). It should be noted that in some implementations, branch selection may be provided via specific levels of the (gate) biasing voltages (e.g., $V_{G1}$, $V_{G2}$, $V_{G1}$, $V'_{G2}$) that control conduction of the respective transistors (e.g., M1, M2, M'1, M'2). In such implementations, provision of the switches $SW_1$ and $SW_2$ may be optional (e.g., S1 and S2 may be unconditionally coupled to one another through the common source node, $N_{CS}$, or through a single switch as shown in FIG. 5). It should further be noted that the multi-branch multi-gain LNA (400) of FIG. 4 may be expanded to include any number of a plurality of branches, and therefore is not limited to the shown exemplary two branches (e.g., M1, M2 and M'1, M'2).

FIG. 5 shows a simplified schematic of a multi-branch multi-gain LNA (500) according to yet another embodiment of the present disclosure that is based on the multi-branch multi-gain LNA (400) described above with reference to FIG. 4. In particular, in the case of the LNA (500), branch selection may be provided via specific levels of the (gate) biasing voltages (e.g., $V_{G1}$, $V_{G2}$, $V'_{G1}$, $V'_{G2}$) that control conduction of the respective transistors (e.g., M1, M2, M'1, M'2). A switch, $SW_{S12}$, coupled between the sources S1 and S2 allow coupling of the two sources when needed. Such coupling may be in view of a desired gain based on combining of two active branches (e.g., M1, M2 and M'1, M'2), or in view of a desired gain based on a degeneration inductance coupled to (only) one active branch. For example, in one case, amplification can be provided by combining both branches (both activated and switch, $SW_{S12}$, closed) while gain can be further adjusted via a combination of $L_{DEG4}$ connected (directly coupled) to S1 and an optional switchable shunting network ($SW'_{L1}$, $R'_{L1}$, $C'_{L1}$) connected to S' 1. In another case, amplification can be provided via only one branch (e.g., M1, M2 or M'1, M'2) while gain can be further adjusted via the combination $L_{DEG4}$ and the optional switchable shunting network ($SW'_{L1}$, $R'_{L1}$, $C'_{L1}$). In such case of amplification via a single branch, the switch, $SW_{S12}$, may be either closed or open. For example, if single branch amplification is provided by (M1, M2), the switch, $SW_{S12}$, may be open and amplification may be further adjusted via $L_{DEG4}$ only, or alternatively, the switch, $SW_{S12}$, may be closed and amplification may be further adjusted via a combination of $L_{DEG4}$ and the optional switchable shunting network ($R'_{L1}$, $C'_{L1}$). On the other hand, if single branch amplification is provided by (M'1, M'2), the switch, $SW_{S12}$, may be closed and amplification may be further adjusted via the combination of $L_{DEG4}$ and the optional switchable shunting network ($SW'_{L1}$, $R'_{L1}$, $C'_{L1}$). It should be noted that the optional switchable shunting network ($SW'_{L1}$, $R'_{L1}$, $C'_{L1}$) may participate in adjusting of gain only when combined with the inductor $L_2$ of $L_{DEG4}$ (while $SW_{L1}$ is open and $SW'_{L1}$ and $SW_{S12}$ are closed). It should further be noted that the resistor $R'_{L1}$ of the optional switchable shunting network ($SW'_{L1}$, $R'_{L1}$, $C'_{L1}$) may not be required, and therefore may be considered as optional. It should further be noted that the optional switchable shunting network ($SW'_{L1}$, $R'_{L1}$, $C'_{L1}$) may be substituted with a anyone of the tunable degeneration networks $L_{DEG2}$, $L_{DEG3}$, $L_{DEG4}$, $L_{DEG5}$ or $L_{DEG6}$ described above.

Figure 6:
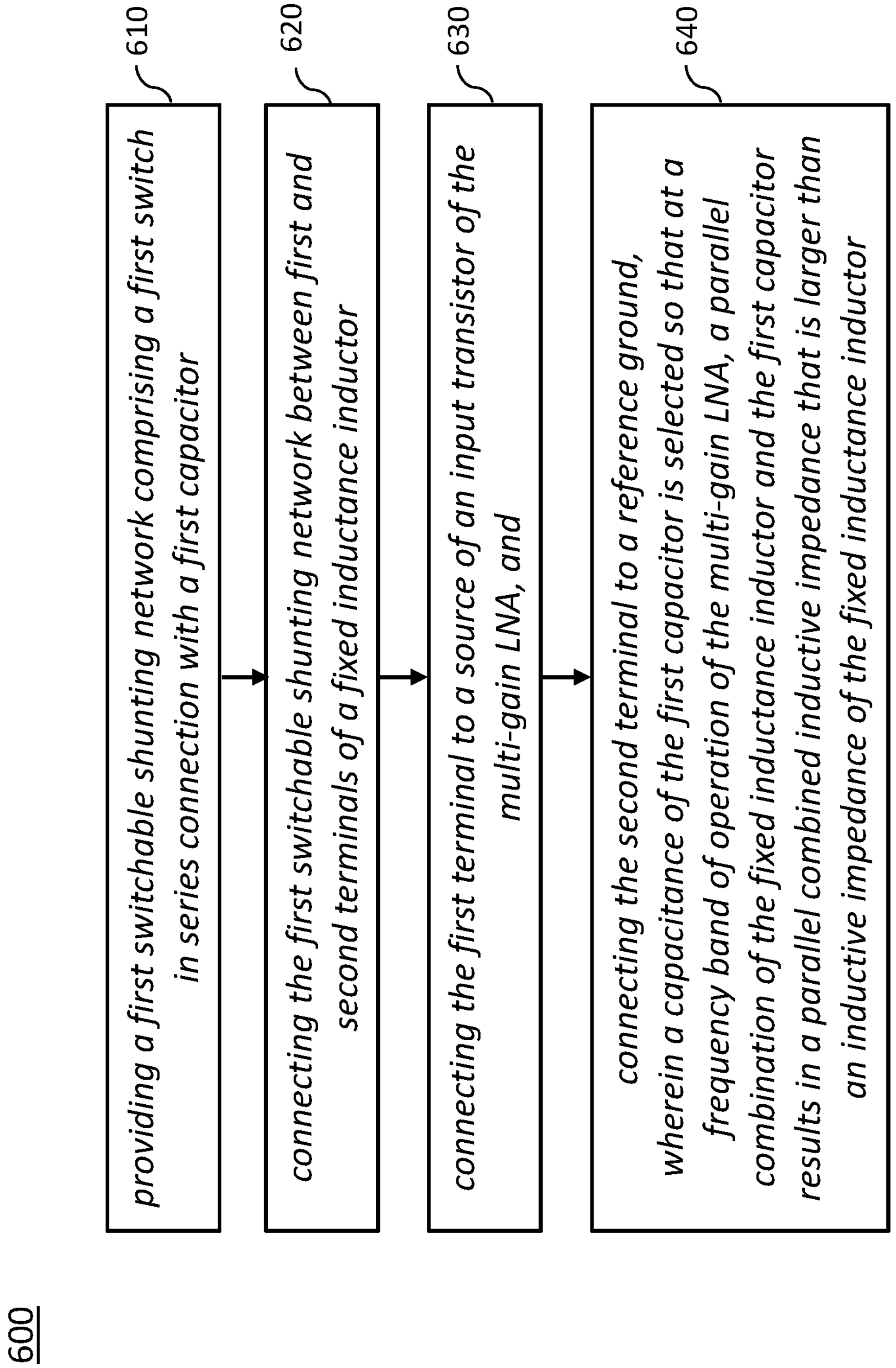
FIG. 6 shows various process steps of a method according to the present disclosure.

FIG. 6 is a process chart (600) showing various steps of a method according to the present disclosure for providing a tunable inductance for a multi-gain low noise amplifier (LNA). As shown in FIG. 6, such steps include: providing a first switchable shunting network comprising a first switch in series connection with a first capacitor, according to step (610); connecting the first switchable shunting network between first and second terminals of a fixed inductance inductor, according to step (620); connecting the first terminal to a source of an input transistor of the multi-gain LNA, according to step (630); and connecting the second terminal to a reference ground, according to step (640), wherein a capacitance of the first capacitor is selected so that at a frequency band of operation of the multi-gain LNA, a parallel combination of the fixed inductance inductor and the first capacitor results in a parallel combined inductive impedance that is larger than an inductive impedance of the fixed inductance inductor.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A multi-gain low noise amplifier (LNA) comprising:
one or more transistors; and
a tunable network coupled to a first transistor of the one or more transistors and a reference ground, wherein the tunable network comprises:
an inductor coupled to the first transistor; and
a first switchable network coupled to the first transistor and the inductor, wherein the first switchable network comprises:
a first capacitor;
a first resistor in series connection with the first capacitor; and
a first switch coupled to the first capacitor, wherein the first capacitor has a capacitance so that at a frequency band of operation of the multi-gain LNA, a parallel combination of the inductor and the first capacitor results in a first parallel combined inductive impedance that is larger than an inductive impedance of the inductor.

2. The multi-gain LNA of claim 1, wherein the inductor and the first switchable network are further coupled to the reference ground.

3. The multi-gain LNA of claim 1, wherein the multi-gain LNA is associated with a first gain mode when the first switch is open, wherein the multi-gain LNA is associated with a second gain mode when the first switch is closed, and wherein the first gain mode is associated with a higher gain than the second gain mode.

4. The multi-gain LNA of claim 1, wherein the first resistor has a resistance to reduce a Q-factor of a resonant circuit provided by the parallel combination of the inductor and the first capacitor.

5. The multi-gain LNA of claim 1, wherein the first switch is connected to the first transistor.

6. The multi-gain LNA of claim 1, wherein the tunable network further comprises a second switchable network coupled to the first transistor and the inductor, wherein the second switchable network comprises:
a second capacitor; and
a second switch coupled to the second capacitor, wherein the second capacitor has a capacitance so that at the frequency band of operation of the multi-gain LNA, a parallel combination of the inductor and the second capacitor results in a second parallel combined inductive impedance that is larger than the inductive impedance of the inductor.

7. The multi-gain LNA of claim 6, wherein the first capacitor is coupled to the second capacitor.

8. The multi-gain LNA of claim 6, wherein:
the multi-gain LNA is associated with:
a first gain mode when the first switch and the second switch are open;
a second gain mode when the first switch is closed and the second switch is open; and
a third gain mode when the first switch is open and the second switch is closed;
the capacitance of the first capacitor is less than the capacitance of the second capacitor; and
a gain of the LNA in the second gain mode is higher than a gain of the LNA in the third gain mode.

9. The multi-gain LNA of claim 8, wherein the multi-gain LNA is further associated with a fourth gain mode when the first switch and the second switch are closed.

10. The multi-gain LNA of claim 1, further comprising an impedance network coupled to the first transistor and the reference ground, wherein the impedance network comprises:
a second resistor; and
a second capacitor coupled to the second resistor.

11. The multi-gain LNA of claim 10, wherein a parallel combination of the inductor with the impedance network is configured to reduce a Q-factor of the inductor.

12. The multi-gain LNA of claim 1, further comprising a second switchable network coupled between a gate of the first transistor and the reference ground, wherein the second switchable network comprises:
a second capacitor; and
a second switch coupled to the second capacitor.

13. The multi-gain LNA of claim 1, wherein a second transistor of the one or more transistors is coupled to the first transistor and the first switchable network.

14. The multi-gain LNA of claim 1, further comprising a second switchable network coupled to a second transistor of the one or more transistors, wherein the second switchable network comprises:
a second capacitor; and
a second switch coupled to the second capacitor.

15. A method of operating a multi-gain low noise amplifier (LNA), the method comprising:
selectively coupling a first capacitor of the multi-gain LNA and a resistor of the multi-gain LNA between a first terminal and a second terminal of an inductor of the multi-gain LNA, wherein the first capacitor is in series connection with the resistor of the multi-gain LNA, wherein a gain mode of the multi-gain LNA is based at least in part on the selectively coupling, wherein the first terminal of the inductor is coupled to a first transistor of one or more transistors of the multi-gain LNA, and wherein the second terminal of the inductor is coupled to a reference ground; and
providing, by the one or more transistors, an output signal to an output port of the multi-gain LNA based on an input signal received at an input port of the multi-gain LNA and the selectively coupling, wherein a capacitance of the first capacitor is selected so that at a frequency band of operation of the multi-gain LNA, a parallel combination of the inductor and the first capacitor results in a first parallel combined inductive impedance that is larger than an inductive impedance of the inductor.

16. The method of claim 15, further comprising selectively coupling a second capacitor of the multi-gain LNA between the first terminal and the second terminal of the inductor, wherein the gain mode of the multi-gain LNA is further based on the selectively coupling the second capacitor, wherein a capacitance of the second capacitor is selected so that at the frequency band of operation of the multi-gain LNA, a parallel combination of the inductor and the second capacitor results in a second parallel combined inductive impedance that is larger than the inductive impedance of the inductor.

17. The method of claim 15, wherein a resistance of the resistor is selected to reduce a Q-factor of a resonant circuit provided by the parallel combination of the inductor and the first capacitor.

18. The method of claim 15, further comprising selectively coupling a second capacitor of the multi-gain LNA between a gate of the first transistor and the reference ground based on the gain mode of the multi-gain LNA.

19. The method of claim 15, further comprising selectively coupling a second capacitor of the multi-gain LNA to a second transistor of the one or more transistors, wherein the gain mode of the multi-gain LNA is further based on the selectively coupling the second capacitor.

20. A multi-gain low noise amplifier (LNA) comprising:

a first transistor;

an inductor having a first terminal coupled to the first transistor and a second terminal coupled to a reference ground;

a first capacitor having a capacitance so that at a frequency band of operation of the multi-gain LNA, a parallel combination of the inductor and the first capacitor results in a first parallel combined inductive impedance that is larger than an inductive impedance of the inductor;

a resistor in series connection with the first capacitor;

means for selectively coupling the first capacitor between the first terminal and the second terminal of the inductor, wherein a gain mode of the multi-gain LNA is based at least in part on the means for selectively coupling; and means for providing an output signal to an output port of the multi-gain LNA based on an input signal received at an input port of the multi-gain LNA and the means for selectively coupling.

21. The multi-gain LNA of claim 20, further comprising:

means for selectively coupling the resistor between the first terminal and the second terminal of the inductor, wherein the resistor has a resistance to reduce a Q-factor of a resonant circuit provided by the parallel combination of the inductor and the first capacitor.

22. The multi-gain LNA of claim 20, further comprising means for selectively coupling a second capacitor between a gate of the first transistor and the reference ground based on the gain mode of the multi-gain LNA.

23. The multi-gain LNA of claim 20, further comprising:

a second transistor;

a second capacitor; and means for selectively coupling the second capacitor to the second transistor, wherein the gain mode of the multi-gain LNA is further based on the means for selectively coupling the second capacitor.

24. The multi-gain LNA of claim 20, further comprising means for reducing a Q-factor of the inductor.

* * * * *